United States Patent
Kuraoka et al.

(10) Patent No.: US 9,196,480 B2
(45) Date of Patent: Nov. 24, 2015

(54) METHOD FOR TREATING GROUP III NITRIDE SUBSTRATE AND METHOD FOR MANUFACTURING EPITAXIAL SUBSTRATE

(71) Applicant: NGK INSULATORS, LTD., Aichi (JP)

(72) Inventors: Yoshitaka Kuraoka, Okazaki (JP); Tomohiko Sugiyama, Nagoya (JP); Sota Maehara, Nagoya (JP)

(73) Assignee: NGK INSULATORS, LTD., Aichi (JP)

( * ) Notice: Subject to any disclaimer, the term of this patent is extended or adjusted under 35 U.S.C. 154(b) by 0 days.

(21) Appl. No.: 14/499,336

(22) Filed: Sep. 29, 2014

(65) Prior Publication Data

US 2015/0017786 A1    Jan. 15, 2015

Related U.S. Application Data

(63) Continuation of application No. PCT/JP2014/057649, filed on Mar. 20, 2014.

(30) Foreign Application Priority Data

Mar. 29, 2013 (JP) .................................. 2013-072508

(51) Int. Cl.
*H01L 21/00* (2006.01)
*H01L 21/02* (2006.01)
(Continued)

(52) U.S. Cl.
CPC .......... *H01L 21/0254* (2013.01); *C30B 25/186* (2013.01); *C30B 29/403* (2013.01);
(Continued)

(58) Field of Classification Search
CPC .............. H01L 21/0254; H01L 21/324; H01L 21/02024; H01L 21/0262; H01L 21/02658; H01L 21/30625; H01L 29/403
See application file for complete search history.

(56) References Cited

U.S. PATENT DOCUMENTS 6,488,767 B1    12/2002    Xu et al.
6,924,159 B2    8/2005    Usui et al.
(Continued)

FOREIGN PATENT DOCUMENTS

EP    1363322 A2    11/2003
JP    2001-322899 A    11/2001
(Continued)

OTHER PUBLICATIONS

International Search Report for PCT Patent App. No. PCT/JP2014/057649 (Jun. 24, 2014).
(Continued)

*Primary Examiner* — Richard Booth
(74) *Attorney, Agent, or Firm* — Cermak Nakajima & McGowan LLP; Tomoko Nakajima

(57) ABSTRACT

Provided is a method for treating a group III nitride substrate capable of obtaining, in the case where a group III nitride layer is laminated thereon, a group III nitride substrate that can form an electronic device having excellent characteristics. The method for treating a group III nitride substrate includes the steps of CMPing a surface of a substrate, elevating a temperature of the group III nitride substrate after the CMP process to a predetermined annealing temperature under a nitrogen gas atmosphere, and holding the group III nitride substrate whose temperature has been elevated to the annealing temperature for four minutes or more and eight minutes or less in a first mixed atmosphere of a hydrogen gas and a nitrogen gas or a second mixed atmosphere of a hydrogen gas and an ammonia gas.

11 Claims, 10 Drawing Sheets

(51) Int. Cl.
*H01L 21/324* (2006.01)
*C30B 25/18* (2006.01)
*C30B 29/40* (2006.01)
*H01L 21/306* (2006.01)

(52) U.S. Cl.
CPC ...... *H01L21/02024* (2013.01); *H01L 21/0262* (2013.01); *H01L 21/02389* (2013.01); *H01L 21/02658* (2013.01); *H01L 21/30625* (2013.01); *H01L 21/324* (2013.01)

(56) References Cited

U.S. PATENT DOCUMENTS

| | | | |
|---|---|---|---|
| 6,951,695 B2 * | 10/2005 | Xu et al. | 428/698 |
| 7,872,285 B2 | 1/2011 | Hashimoto et al. | |
| 8,030,681 B2 | 10/2011 | Ishibashi | |
| 8,471,364 B2 | 6/2013 | Ishibashi | |
| 9,070,828 B2 * | 6/2015 | Ishibashi | 1/1 |
| 2005/0139960 A1 | 6/2005 | Shibata | |
| 2011/0274609 A1 | 11/2011 | Shimodaira et al. | |
| 2011/0306209 A1 | 12/2011 | Ishibashi | |
| 2013/0249060 A1 | 9/2013 | Ishibashi | |

FOREIGN PATENT DOCUMENTS

| | | |
|---|---|---|
| JP | 3631724 B2 | 12/2004 |
| JP | 2005-136311 A | 5/2005 |
| JP | 3894191 B2 | 12/2006 |
| JP | 2010-163307 A | 7/2010 |
| JP | 4984557 B2 | 5/2012 |
| JP | 2012-235136 A | 11/2012 |
| WO | WO2010/084675 A1 | 7/2010 |

OTHER PUBLICATIONS

Supplementary European Search Report for European Patent App. No. 14772262.3 (Sep. 9, 2015).

* cited by examiner

F I G. 1
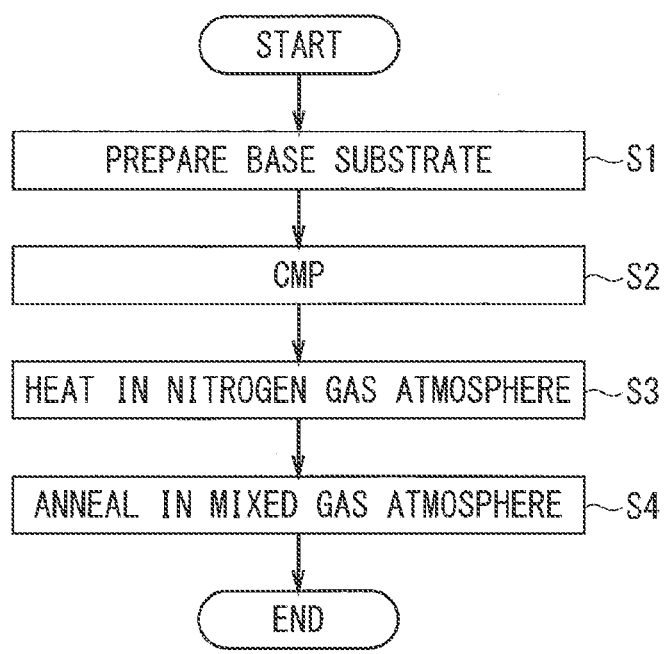

F I G. 2
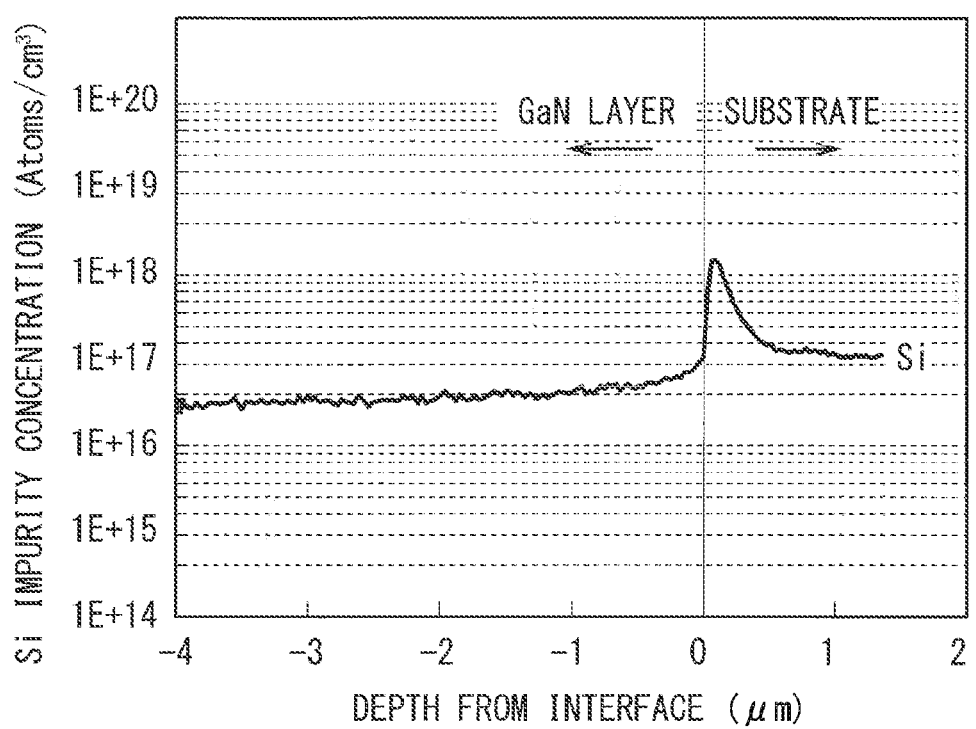

F I G. 3
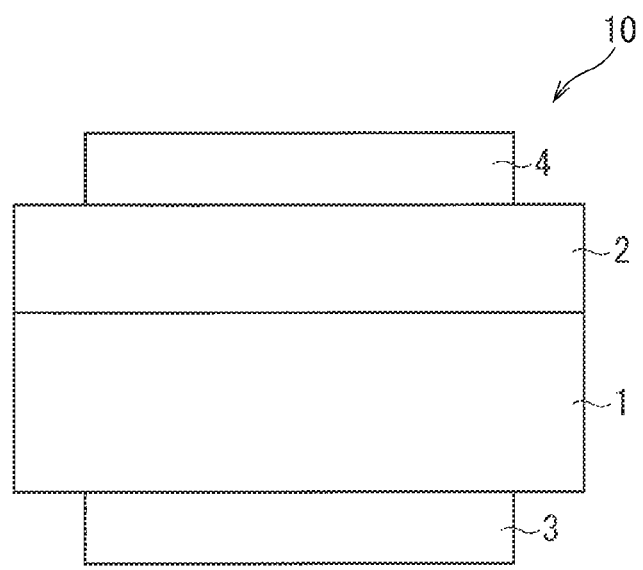

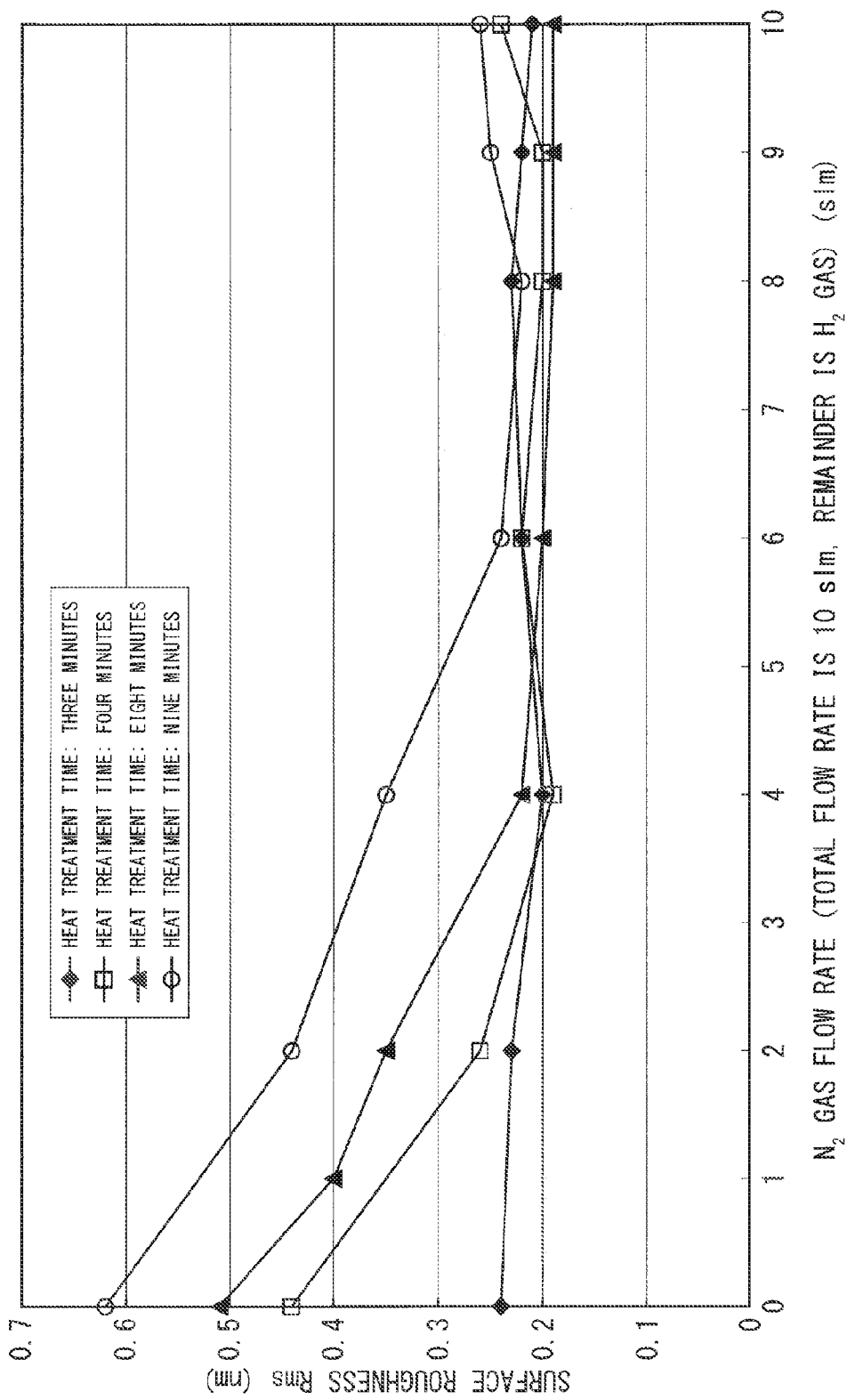
F I G. 5

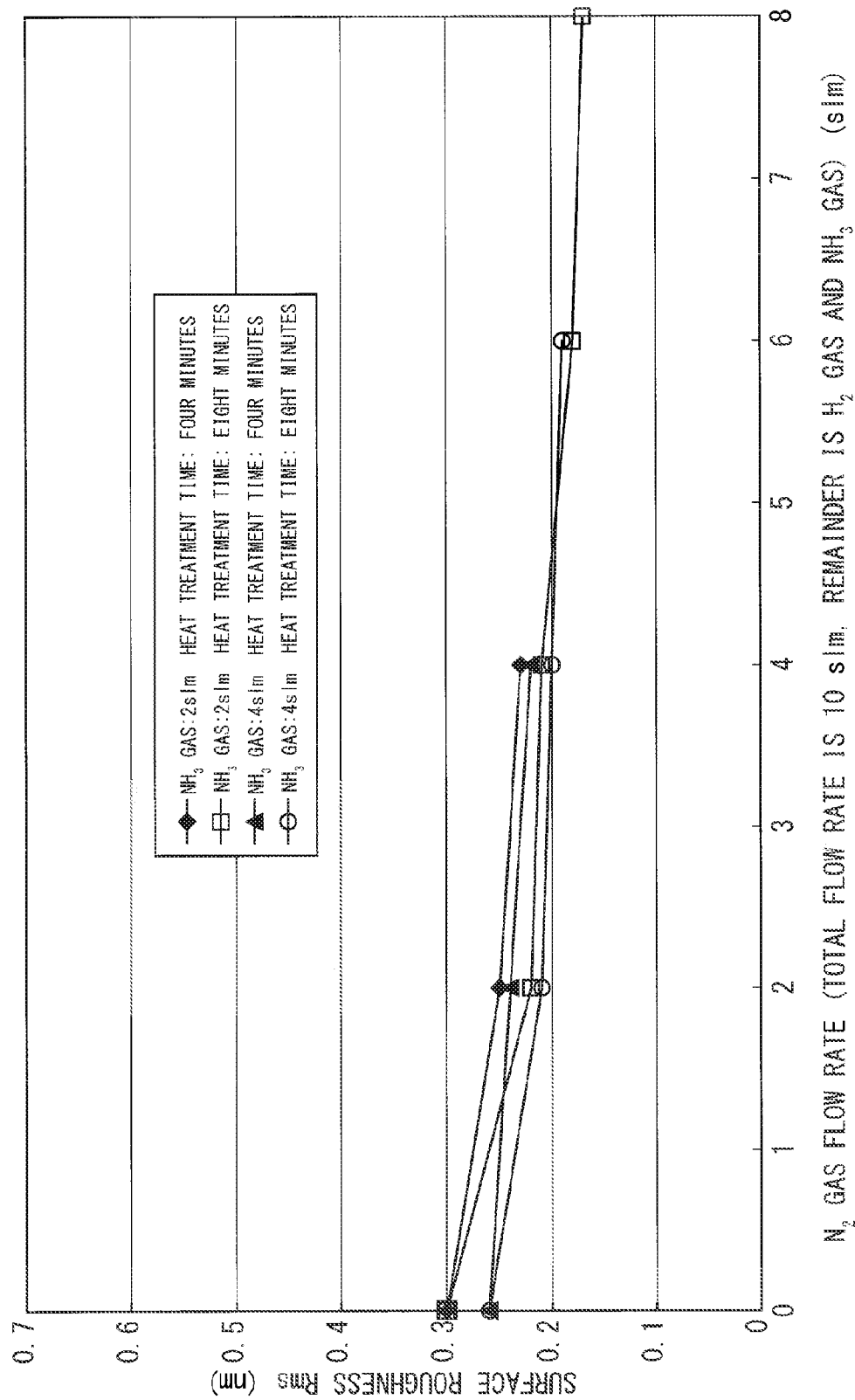

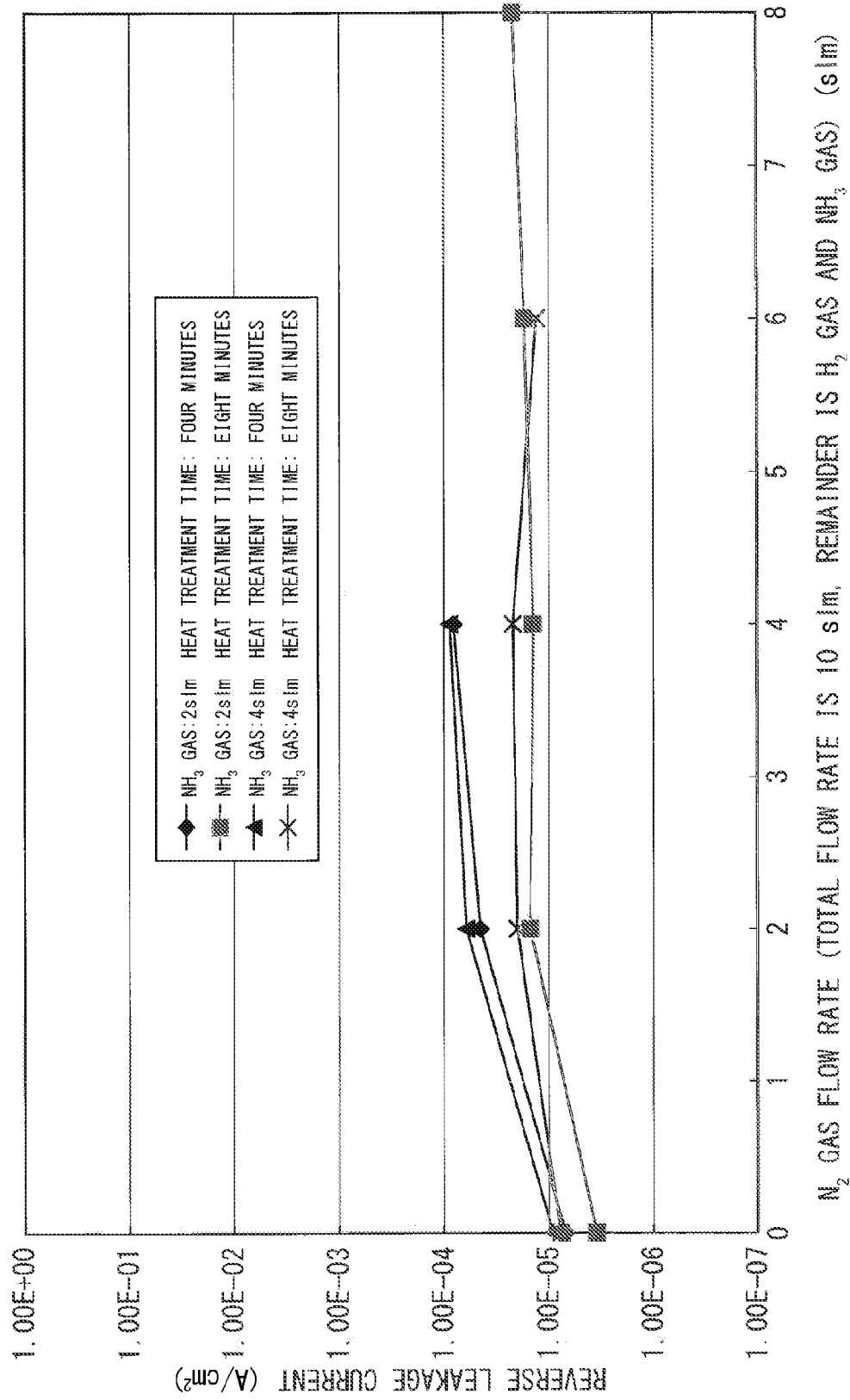

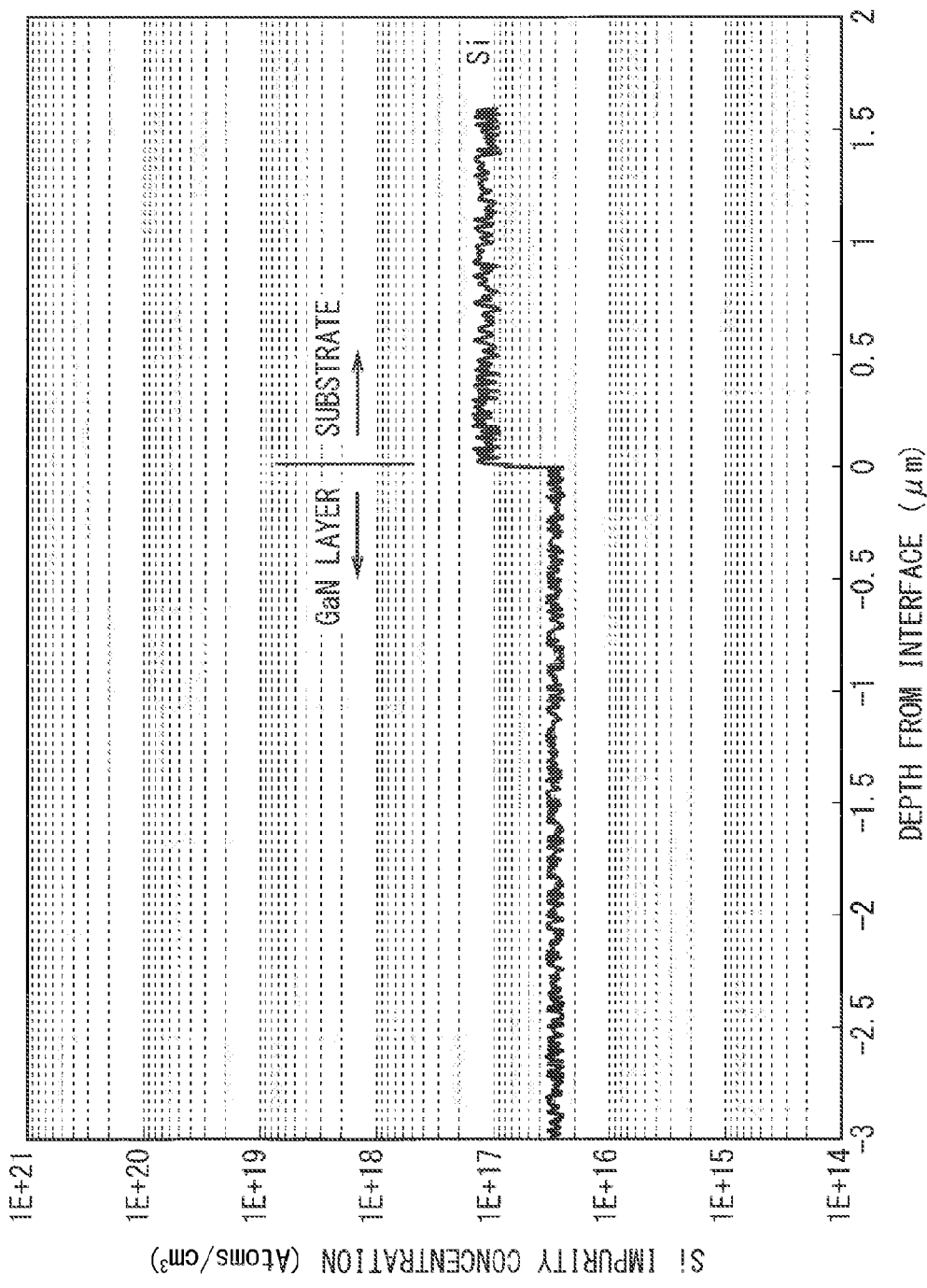

METHOD FOR TREATING GROUP III NITRIDE SUBSTRATE AND METHOD FOR MANUFACTURING EPITAXIAL SUBSTRATE

TECHNICAL FIELD

The present invention relates to a method for treating a group III nitride crystal, more particularly, to a pretreatment method to be performed on a group III nitride substrate before growing a group III nitride crystal on the group III nitride substrate.

BACKGROUND ART

Group III nitride crystals (single crystals) such as gallium nitride (GaN) are widely used as the base substrates of electronic devices including high electron mobility transistors (HEMTs) and optical devices including light-emitting devices such as light-emitting diodes (LEDs) and light-receiving devices and as the functional layers exhibiting desired device characteristics in those devices.

A substrate formed of a group III nitride crystal (group III nitride substrate) is obtained by growing a group III nitride crystal on a base substrate made of a group III nitride crystal having the same or different compositions or a base substrate made of heterogeneous materials such as sapphire and silicon. The base substrate used in such a case may also be referred to as a seed crystal. Alternatively, in some cases, a group III nitride crystal is grown, and then, a base substrate is removed.

A well-known technology forms a GaN layer on a GaN epitaxial substrate obtained by forming a GaN layer on a sapphire substrate by a vapor phase method and then peels off the sapphire substrate, to thereby obtain a freestanding GaN substrate being a group III nitride substrate (for example, see Patent Document 1). Another well-known technology forms a group III nitride crystal on a seed crystal substrate by a flux method that is one type of liquid phase method (for example, see Patent Document 2).

In another well-known technology, before growing a group III nitride crystal on a GaN substrate by the metal organic chemical vapor deposition method (MOCVD method), to reduce an influence of polishing scratches existing on the surface of the GaN substrate on crystal growth, the GaN substrate is heat-treated at a temperature of 1100° C. or higher for 10 minutes or more under the atmosphere of a process gas containing ammonia and hydrogen in a MOCVD apparatus (for example, see Patent Document 3).

Another well-known technology forms an n$^+$GaN layered region including silicon (Si) in an interfacial region when a GaN epitaxial film is grown on a freestanding GaN substrate (for example, see Patent Document 4).

In the case where a nitride layer is deposited to have a thickness of several to several tens μm on a GaN substrate by, for example, the MOCVD method so that a HEMT structure or an LED structure is laminated, a steep lamination interface having good crystal quality is needed to improve the device characteristics. For that purpose, the surface of the GaN substrate is required to be flat. Chemical mechanical polishing (CMP) is typically applied as the method for treating a GaN substrate surface, which is performed prior to layer lamination.

Unfortunately, an electronic device, formed by laminating a GaN layer on a GaN substrate after the CMP process by the MOCVD method, has not obtained characteristics expected from its design value. In particular, n-type carriers have been difficult to control.

To identify its cause, the inventors of the present invention have conducted analysis by secondary ion mass spectrometory (SIMS) to find that a high-concentration Si impurity layer exists at an interface between a GaN layer and a GaN substrate.

The following is conceivable as a contributing factor to the formation of such a Si impurity layer: abrasive grains (colloidal silica), which have adhered to the surface of a GaN substrate in CMPing the surface before the formation of a GaN layer and have not been completely removed after the subsequent cleaning process to remain as particles on the affected layer formed on the surface of the GaN substrate, and deposits, which have volatilized from a case or the like to adhere to the surface of the GaN substrate while a GaN substrate has been stored, diffuse when it is heated to have an elevated temperature in GaN layer formation.

The affected layer exists with a thickness of several to several tens nm from the surface of the GaN substrate, which conceivably contributes to Si diffusion. It is thus conceivable to perform the heat treatment as disclosed in, for example, Patent Document 3, to remove a high-concentration Si impurity layer when the affected layer is removed. In such a case, however, the flatness obtained through the CMP process becomes deteriorated, resulting in the degradation of device characteristics of LEDs or the like.

PRIOR ART DOCUMENTS

Patent Documents

Patent Document 1: Japanese Patent No. 3631724
Patent Document 2: International Publication No. 2010/84675
Patent Document 3: Japanese Patent No. 3894191
Patent Document 4: Japanese Patent No. 4984557

SUMMARY OF INVENTION

The present invention has been made in view of the above-mentioned problem, and an object thereof is to provide a method for treating a group III nitride substrate capable of obtaining, in the case where a group III nitride layer is laminated thereon, a group III nitride substrate that can form an electronic device having excellent characteristics.

In order to solve the above-mentioned problem, a first aspect of the present invention relates to a method for treating a group III nitride substrate, which includes: a CMP step of chemically mechanically polishing a surface of a group III nitride substrate; a temperature elevating step of elevating a temperature of the group III nitride substrate after the CMP step to an annealing temperature of 950° C. or higher and 1150° C. or lower under a nitrogen gas atmosphere; and an annealing step of holding the group III nitride substrate whose temperature has been elevated to the annealing temperature through the temperature elevating step for four minutes or more and eight minutes or less in a first mixed atmosphere of a hydrogen gas and a nitrogen gas or a second mixed atmosphere of a hydrogen gas and an ammonia gas.

In a second aspect of the present invention, in the method for treating a group III nitride substrate according to the first aspect, a mixing ratio of the hydrogen gas in the first and second mixed atmospheres is set to 1/10 to 8/10.

In a third aspect of the present invention, in the method for treating a group III nitride substrate according to the first or second aspect, the annealing temperature is 1000° C. or higher and lower than 1100° C.

A fourth aspect of the present invention relates to a method for manufacturing an epitaxial substrate in which a group III nitride layer is epitaxially formed on a group III nitride substrate, which includes: a CMP step of chemically mechanically polishing a surface of a group III nitride substrate; a placing step of placing the group III nitride substrate after the CMP step in an apparatus for epitaxially forming a group III nitride layer on the group III nitride substrate; a temperature elevating step of elevating a temperature of the group III nitride substrate after the placing step to an annealing temperature of 950° C. or higher and 1150° C. or lower under a nitrogen gas atmosphere in the apparatus; an annealing step of holding the group III nitride substrate whose temperature has been elevated to the annealing temperature through the temperature elevating step for four minutes or more and eight minutes or less in a first mixed atmosphere of a hydrogen gas and a nitrogen gas or a second mixed atmosphere of a hydrogen gas and an ammonia gas in the apparatus; and an epitaxially forming step of epitaxially forming the group III nitride layer on the group III nitride substrate after the annealing step in the apparatus.

In a fifth aspect of the present invention, in the method for manufacturing an epitaxial substrate according to the fourth aspect, a mixing ratio of the hydrogen gas in the first and second mixed atmosphere is set to 1/10 to 8/10.

In a sixth aspect of the present invention, in the method for manufacturing an epitaxial substrate according to the fourth or fifth aspect, the annealing temperature is 1000° C. or higher and lower than 1100° C.

In a seventh aspect of the present invention, in the method for manufacturing an epitaxial substrate according to any one of fourth to sixth aspects, a temperature for epitaxially forming the group III nitride layer in the epitaxially forming step is made identical to the annealing temperature.

According to the first to seventh aspects of the present invention, a group III nitride substrate is obtained so that the formation of a Si impurity layer on a surface thereof is suitably suppressed and so that an electronic device having excellent characteristics is obtainable in the case where a group III nitride layer is epitaxially formed to produce an electronic device, and furthermore, an epitaxial substrate in which the group III nitride layer is formed on the group III nitride substrate is also obtainable.

BRIEF DESCRIPTION OF DRAWINGS

FIG. 1 shows the procedure of treating a group III nitride substrate.

FIG. 2 shows a profile showing the results of SIMS measurements in the case where an n-conductivity-type GaN layer whose dopant is Si is formed on a group III nitride substrate made of GaN by the MOCVD method immediately after the CMP process.

FIG. 3 schematically shows a configuration of a Schottky barrier diode 10.

FIG. 5 is a graph in which values of Rms value on the surface of a GaN layer 2 in various epitaxial substrates are plotted according to a flow rate of a nitrogen gas in a mixed gas atmosphere.

FIG. 8 is a graph in which values of Rms value on the surface of the GaN layer 2 in various epitaxial substrates are plotted according to a flow rate of a nitrogen gas in a mixed gas atmosphere.

FIG. 9 is a graph in which values of reverse leakage current in the Schottky barrier diode 10 are plotted according to a flow rate of a nitrogen gas in a mixed gas atmosphere.

FIG. 10 is a profile showing the results of SIMS measurements of an epitaxial substrate according to Example 1.

EMBODIMENT FOR CARRYING OUT THE INVENTION

Figure 4:
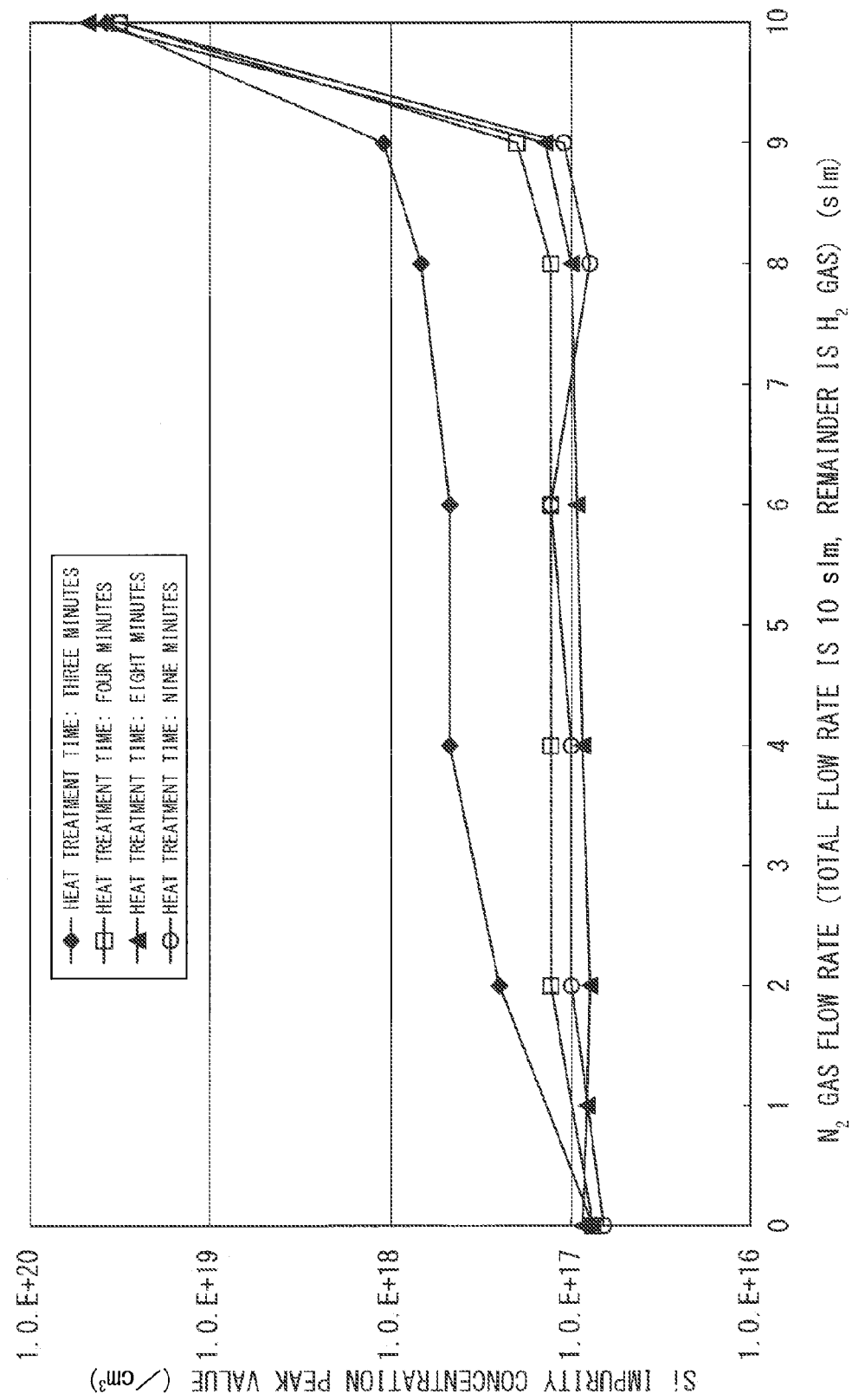
FIG. 4 is a graph in which values of Si concentration (Si impurity concentration) in various epitaxial substrates are plotted according to a flow rate of a nitrogen gas in a mixed gas atmosphere.

FIG. 1 shows the procedure of treating a group III nitride substrate according to this embodiment. First, a group III nitride substrate is prepared (Step S1). The group III nitride substrate is a freestanding substrate made of, for example, a group III nitride crystal (single crystal) such as GaN. The group III nitride substrate may be made of AlN, InN, BN, or the like in addition to GaN, or may be made of a mixed crystal thereof. Alternatively, a substrate made of heterogeneous materials such as sapphire and silicon may be used as the group III nitride substrate. Still alternatively, a so-called template substrate may be used, which is obtained by epitaxially forming a crystal layer of the above-mentioned group III nitride on a substrate made of sapphire, silicon, or the like. The group III nitride substrate preferably has a thickness of about several hundreds μm to several mm.

The prepared group III nitride substrate is subjected to the chemical mechanical polishing (CMP) process (Step S2). CMP is preferably performed for about two to five hours using colloidal silica having a particle size of 0.05 to 0.1 μm as grains.

For example, if a surface roughness Rms (root mean square) of the group III nitride substrate before the CMP process is 1 to 3 nm, CMP reduces Rms to 0.1 to 0.3 nm. In this embodiment, Rms is evaluated by measuring 3 μm×3 μm square region with an atomic force microscope (AFM) and analyzing the measurement results.

The inventors of the present invention have confirmed that as a result of the CMP process, Si impurities attributable to the colloidal silica used in CMP remain on the surface of the group III nitride substrate. FIG. 2 shows the results (profile) of the secondary ion mass spectrometry (SIMS) illustrating the above-mentioned fact. FIG. 2 shows the results of SIMS measurements in the case where an n-conductivity-type GaN layer whose dopant is Si is formed on a group III nitride substrate made of GaN immediately after the CMP process. The horizontal axis "depth from an interface" in FIG. 2 represents, as a value, the distance from the interface between the group III nitride substrate and the GaN layer in the lamination direction, where the direction toward the group III nitride substrate from the interface is positive and the direction toward the GaN layer from the interface is negative.

FIG. 2 shows that Si impurities are unevenly distributed in the group III nitride substrate near the interface with the GaN layer at concentrations higher than those of its surrounding by about one to two orders. In other words, it could be said that a Si impurity layer is formed. The inventors of the present invention have confirmed that the presence of such Si impurities may deteriorate characteristics of the electronic device produced by forming a group III nitride layer on a group III nitride substrate.

In this embodiment, therefore, the following processes are performed on the group III nitride substrate to remove Si impurities and produce an electronic device having excellent characteristics.

To be specific, the group III nitride substrate that has been subjected to CMP is heated to elevate its temperature in a nitrogen gas atmosphere (Step S3). Subsequently, the heat treatment (annealing treatment) is performed in which the group III nitride substrate is held in a mixed atmosphere of a hydrogen gas and a nitrogen gas or a mixed atmosphere of a hydrogen gas and an ammonia gas having a predetermined temperature (Step S4).

The heating for elevating temperature in a nitrogen gas atmosphere is performed until the substrate temperature reaches the temperature for the subsequent annealing treatment (annealing temperature). The annealing temperature is preferably 950° C. or higher and 1150° C. or lower, and more preferably, is 1000° C. or higher and lower than 1100° C. Preferably, the temperature elevating rate is about 50° C./min to 120° C./min.

Preferably, the gas mixing ratio in a mixed atmosphere in the annealing treatment is roughly such that (hydrogen gas): (nitrogen gas) or (ammonia gas)=8:2 to 1:9. In other words, the mixing ratio of a hydrogen gas to the whole mixed gas is preferably 1/10 to 8/10. Preferably, the time for the annealing treatment is about four to eight minutes.

As a result of the above-mentioned heating for elevating temperature in a nitrogen gas atmosphere and the subsequent annealing treatment in a mixed gas atmosphere, a group III nitride substrate in which the formation of a Si impurity layer on its surface is suitably suppressed is obtained. This group III nitride substrate is subsequently subjected to the process of forming a group III nitride layer for the production of an electronic device, so that an electronic device having excellent characteristics can be obtained. For example, an electronic device having excellent breakdown voltage characteristics can be obtained, in which the reverse leakage current serving as an index of the breakdown voltage in the electronic device is $1 \times 10^{-5}$ A/cm$^2$ or less.

Heating for elevating temperature and the annealing treatment are preferably performed in a film formation apparatus that performs the process of forming a group III nitride layer on a group III nitride substrate subsequently to the heating and annealing.

For example, in the formation of a group III nitride layer by the MOCVD method, the group III nitride substrate after the CMP process is placed on a susceptor at which the group III nitride substrate is placed in forming a group III nitride in a reaction tube of the MOCVD apparatus, and the group III nitride substrate is heated through the susceptor while flowing a nitrogen gas from a nitrogen gas supply source into the reaction tube, to thereby heat the group III nitride substrate to elevate its temperature. Then, when the group III nitride substrate reaches a predetermined annealing temperature, a mixed atmosphere of a hydrogen gas and a nitrogen gas or a mixed atmosphere of a hydrogen gas and an ammonia gas is caused to flow at such a flow rate ratio as to satisfy the above-mentioned mixing ratio while keeping the base substrate at the annealing temperature, to thereby perform the annealing treatment. Then, after the annealing treatment is complete, the process of forming a group III nitride layer having a desired composition is performed.

It is preferable that a group III nitride layer is epitaxially formed by the MOCVD method where, for example, a hydrogen gas and a nitrogen gas are used as carrier gases, an ammonia gas and trimethylgallium (TMG), trimethylaluminum (TMA), trimethylindium (TMI), or the like bubbled with a hydrogen gas are used as source gases while a silane gas or other gas is further added as a dopant gas as required.

In such a case, a group III nitride layer can be immediately formed on a clean group III nitride substrate after the annealing treatment, whereby an electronic device having more excellent characteristics can be produced.

As described above, according to this embodiment, heating for elevating temperature in a nitrogen gas atmosphere after the CMP process and subsequently the annealing treatment in a mixed atmosphere of a hydrogen gas and a nitrogen gas or a mixed atmosphere of a hydrogen gas and an ammonia gas make it possible to obtain a group III nitride substrate that the formation of a Si impurity layer on its surface is suitably suppressed and that an electronic device having excellent characteristics is obtained in the case where a group III nitride layer is epitaxially formed thereon to produce the electronic device.

EXAMPLES

Example 1

In this example, a plurality of group III nitride substrates were prepared and the annealing treatment (heat treatment) was performed thereon in a mixed atmosphere of a hydrogen gas and a nitrogen gas by varying treatment conditions, and then, the group III nitride substrates after this annealing were used to produce epitaxial substrates. In this embodiment, an epitaxial substrate refers to a substrate obtained by epitaxially forming a group III nitride layer on a group III nitride substrate.

Further, the obtained epitaxial substrate was used to produce a Schottky barrier diode as one type of electronic device structure. FIG. 3 schematically shows the configuration of a Schottky barrier diode 10 produced in this example.

During the series of processes, AFM measurements targeted for the group III nitride substrate after the CMP process and the epitaxial substrate were performed, and the mean square roughness (Rms) based on the measurement results was calculated. Also, the Si distribution was measured by SIMS, and the reverse leakage current of the Schottky barrier diode 10 was evaluated.

To be specific, a plurality of C-plane freestanding GaN substrates, having a diameter of four inches, a thickness of 0.5 mm, and a Si doping amount of about $1 \times 10^{17}$/cm$^3$, were prepared as a group III nitride substrate and were each subjected to the CMP process for 150 minutes. The 3 μm×3 μm square range thereof was subjected to AFM measurements to obtain an Rms value. Consequently, the Rms values of all the substrates fell within the range of 0.15 nm or more and 0.20 nm or less.

The group III nitride substrate after the CMP process was arranged in the susceptor in the reactor tube of the MOCVD apparatus, and the temperature of the group III nitride substrates was elevated while keeping the pressure inside the reactor tube at 0.3 atm until the substrate temperature (susceptor temperature) reached 1080° C. in a nitrogen gas atmosphere.

When the substrate temperature reached 1080° C., a mixed atmosphere of a hydrogen gas and a nitrogen gas having a predetermined mix ratio is introduced into the reaction tube while keeping the pressure inside the reaction tube at 0.3 atm, and then, the annealing treatment (heat treatment) was performed. The treatment time was different four levels of three minutes, four minutes, eight minutes, and nine minutes. The mixed gas atmosphere was produced, while keeping the total flow rate at 10 slm, by setting the flow rate of a nitrogen gas to 0 slm (that is, a hydrogen gas atmosphere alone), 1 slm (only for the treatment time of eight minutes), 2 slm, 4 slm, 6 slm, 8 slm, 9 slm, or 10 slm (that is, a nitrogen gas atmosphere alone) and setting the remainder of the mixed atmosphere as a hydrogen gas.

After the annealing treatment, the pressure inside the reaction tube was set to 1 atm while keeping the substrate temperature at 1080° C. equal to the temperature in the annealing treatment (annealing temperature), and then, an n-type GaN layer was epitaxially formed to have a thickness of 2 µm where a hydrogen gas and a nitrogen gas were used as carrier gases, an ammonia gas and trimethylgallium (TMG) bubbled with a hydrogen gas were used as source gases, and further, a silane gas was used as a dopant gas. After the formation of the GaN layer, the substrate temperature was lowered to room temperature, and then, the obtained epitaxial substrate was taken out of the MOCVD apparatus. The gas flow rate ratio between an ammonia gas and TMG, or, V/III ratio was set to 1800. The silane gas was introduced such that the Si concentration in the GaN layer was about $3\times10^{16}/cm^3$.

The 3 µm×3 µm square range of the surface of each epitaxial substrate (surface of the GaN layer) obtained was measured with an AFM to calculate Rms based on the obtained measurement result.

Part of each epitaxial substrate was cut out, and the Si concentration at the interface between the group III nitride substrate and the GaN layer was analyzed by SIMS, to thereby evaluate a maximum value (peak value) in the obtained profile. For any of the epitaxial substrates, a maximum value of the profile was obtained in the group III nitride substrate near the interface with the GaN layer.

Further, the remaining portion of the epitaxial substrate, which has not been analyzed by SIMS, was used to produce a Schottky barrier diode 10 shown in FIG. 3. The Schottky barrier diode 10 includes a base substrate 1, a GaN layer 2, an ohmic electrode 3 being a multilayer electrode of Ti and Al, and a Schottky electrode 4 made of Ni.

To be specific, part of the left epitaxial substrate that has not been analyzed with SIMS was further cut out, to thereby obtain a laminate of the base substrate 1 derived from a group III nitride substrate and the GaN layer 2. Then, a metal mask having an opening size of 250 µm was placed to be in contact with the surface on the side of the base substrate 1, on which the GaN layer 2 was not formed, and a Ti film and an Al film were subjected to electron beam (EB) deposition to have thicknesses of 30 nm and 1000 nm, respectively, thereby obtaining the ohmic electrode 3. After the deposition, annealing was performed at 650° C. for one minute in a rapid thermal annealing furnace (RTA).

Then, a Ni film was formed to have a thickness of 100 nm on the GaN layer 2 by EB deposition using the same metal mask, thereby obtaining the Schottky electrode 4. The Schottky electrode 4 was formed at the same position as that of the ohmic electrode 3 in the thickness direction.

Voltages within the range of 0 to 600 V were applied to the Schottky barrier diode 10 obtained in the above-mentioned manner, and then, a reverse leakage current was measured.

Figure 6:
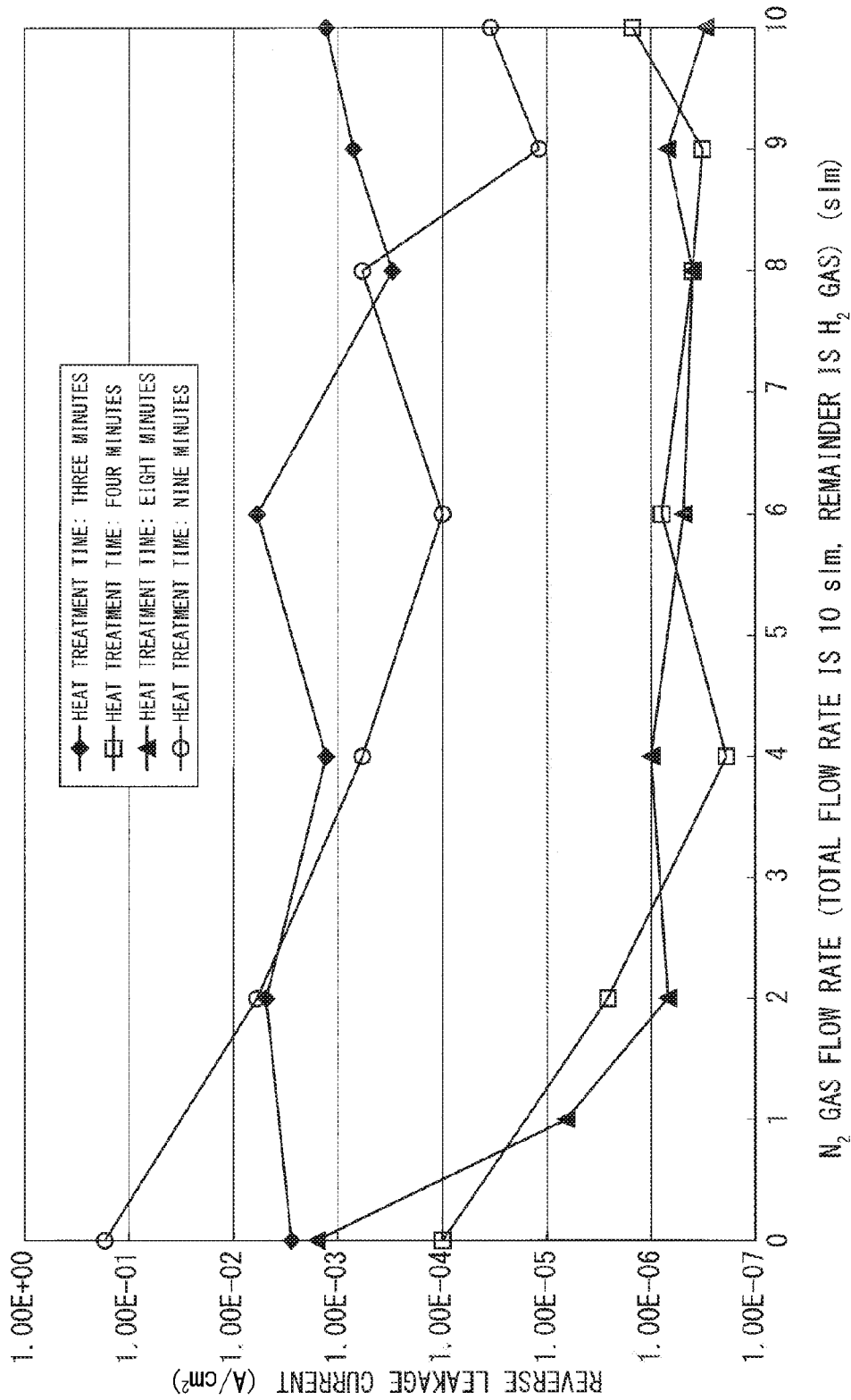
FIG. 6 is a graph in which values of reverse leakage current in the Schottky barrier diode 10 are plotted according to a flow rate of a nitrogen gas in a mixed gas atmosphere.

FIGS. 4 to 6 are graphs in which the maximum values (peak values) of Si concentration (Si impurity concentration) in various epitaxial substrates, the Rms values on the surface of the GaN layer 2, and the values of reverse leakage current in the Schottky barrier diode 10, which have been obtained as described above, are plotted according to a flow rate of a nitrogen gas in a mixed gas atmosphere, respectively. For any of the epitaxial substrates, the measurement value of the reverse leakage current increases monotonously in the range of an applied voltage from 0 to 600 V. For this reason, FIG. 6 shows values for an applied voltage of 600 V.

As shown in FIG. 4, for the heat-treatment time (annealing time) of four minutes or more, as far as the flow rate of a nitrogen gas is in the range equal to or less than 9 slm, a maximum value of the Si impurity concentration stays at about $1\times10^{17}/cm^3$ comparable to the Si doping amount in the original group III nitride substrate.

For example, FIG. 10 shows the results (profile) of SIMS measurements on the epitaxial substrate derived from the group III nitride substrate that has been subjected to the annealing treatment on conditions that the annealing time is eight minutes and the flow rate of a nitrogen gas is 9 slm (the flow rate of a hydrogen gas is 1 slm). The horizontal axis "depth from an interface" in FIG. 10 is as in the case of FIG. 2. Differently from the profile shown in FIG. 2, in the profile shown in FIG. 10, a conspicuous peak is not found, the Si concentration on the substrate side is almost constant at about $1\times10^{17}/cm^3$, and the Si concentration on the GaN layer side is almost constant at about $3\times10^{16}/cm^3$. Although not shown, a similar profile is obtained for the epitaxial substrate produced using a group III nitride substrate that has been subjected to the annealing treatment on conditions that the annealing time is four minutes or more and the flow rate of a nitrogen gas is 9 slm or less.

The above means that Si impurities are prevented from being unevenly distributed at the interface between the group III nitride substrate and the GaN layer in the epitaxial substrate produced using the group III nitride substrate that has been subjected to the annealing treatment on conditions that the annealing time is four minutes or more and the flow rate of a nitrogen gas is 9 slm or less.

Meanwhile, FIG. 5 shows a tendency that the surface roughness will become deteriorated with a decreasing flow rate of a nitrogen gas and a longer annealing time. FIG. 6 shows that the reverse leakage current is reduced to $1\times10^{-5}$ A/cm² or less in the case where heat treatment time is four minutes and eight minutes and a nitrogen gas flow rate is 2 slm or more (less than 10 slm).

In the light of the results shown in FIGS. 4 to 6, an electronic device including a group III nitride substrate having excellent characteristics, which has a reduced Si impurity concentration near the interface with the GaN layer made of the group III nitride, is preferably produced by annealing a group III nitride substrate that has been subjected to the CMP process for four minutes or more and eight minutes or less under a mixed gas atmosphere in which a mixing ratio of a hydrogen gas and a nitrogen gas is roughly such that (hydrogen gas):(nitrogen gas)=8:2 to 1:9, in other words, under a mixed gas atmosphere of a hydrogen gas and a nitrogen gas in which a mixing ratio of a hydrogen gas to the whole mixed gas is 1/10 to 8/10.

In more detailed evaluation of the results shown in FIGS. 4 to 6, for the flow rate of a nitrogen gas less than 2 slm (the mixing ratio of a nitrogen gas is low and the mixing ratio of a hydrogen gas is high), the Si impurity concentration is reduced but the surface roughness becomes deteriorated. It is therefore presumed that the interface between the Schottky electrode 4 and the GaN layer 2 is not formed sufficiently and Schottky characteristics become deteriorated, and it is accordingly conceivable that reverse leakage current tends to increase. Meanwhile, for the flow rate of a nitrogen gas more than 9 slm (the mixing ratio of a nitrogen gas is high and the mixing ratio of a hydrogen gas is low), the surface roughness of the GaN layer 2 is kept low but the Si impurity concentration on the surface of the GaN layer 2 tends to increase. This is conceivably due to the fact that Si does not exist for such an amount as indicated by a design value in the GaN layer 2 near the interface with the base substrate 1 and diffuses on the base substrate 1 side. This leads to a presumption that reverse leakage current does not decrease even if the mixing ratio of a nitrogen gas increases.

Example 2

The CMP process for a group III nitride substrate to the measurement of the reverse leakage current of a Schottky barrier diode were performed as in Example 1 except for that the type of a mixed gas and the treatment time in the annealing treatment were varied.

To be specific, the treatment time was different two levels of four minutes and eight minutes. Meanwhile, with the total flow rate of a mixed gas atmosphere being kept at 10 slm, the flow rate of an ammonia gas was fixed at 2 or 4 slm, and the flow rate of a nitrogen gas was varied, up to 8 slm. The remainder of the mixed gas atmosphere was a hydrogen gas.

Figure 7:
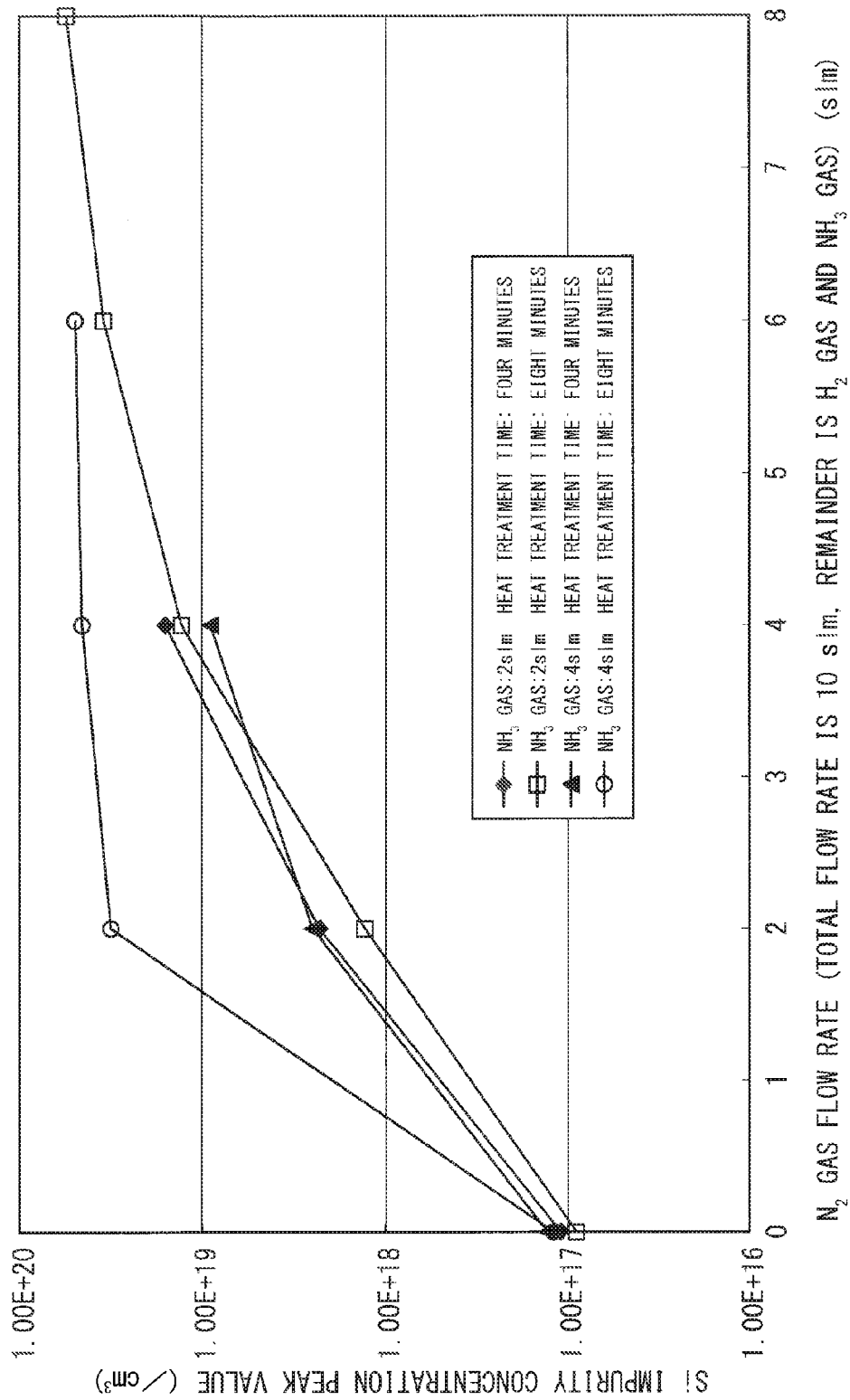
FIG. 7 is a graph in which values of Si concentration (Si impurity concentration) in various epitaxial substrates are plotted according to a flow rate of a nitrogen gas in a mixed gas atmosphere.

FIGS. 7 to 9 are graphs in which the maximum values (peak values) of Si concentration (Si impurity concentration) in various epitaxial substrates, the Rms values of the surface of the GaN layer 2, and the values of reverse leakage current in the Schottky barrier diode 10, which have been obtained as described above, are plotted according to a flow rate of a nitrogen gas in a mixed gas atmosphere, respectively. For any of the epitaxial substrates, a maximum value of the Si concentration profile was obtained in the group III nitride substrate near the interface with the GaN layer. Also, for any of the epitaxial substrates, the measurement value of the reverse leakage current increases monotonously in the range of an applied voltage from 0 to 600 V. For this reason, FIG. 9 shows values for an applied voltage of 600 V.

FIGS. 7 to 9 show that in the case where a mixed atmosphere gas of a hydrogen gas and an ammonia gas, which contains no nitrogen gas, was used, Si impurities were prevented from being unevenly distributed at the interface between the group III nitride substrate and the GaN layer, and that the reverse leakage current was reduced to $1 \times 10^{-5}$ A/cm$^2$ or less. FIG. 8 shows that the Rms value tends to decrease slightly with a higher nitrogen gas flow rate but is about 0.3 nm at a maximum. Thus, it could be said that good flatness is secured on the surface of the GaN layer also in the case where a mixed atmosphere gas of a hydrogen gas and an ammonia gas, which contains no nitrogen gas, is used.

The results show that also in the case where a group III nitride substrate after the CMP process has been annealed using a mixed gas atmosphere of a hydrogen gas and an ammonia gas in which a mixing ratio of a hydrogen gas to the whole mixed gas is 1/10 to 8/10 in place of using a mixed gas atmosphere of a hydrogen gas and a nitrogen gas, the Si impurity concentration is reduced in the group III nitride substrate near the interface with the GaN layer and an electronic device having excellent characteristics can be produced using the group III nitride substrate.

The invention claimed is:

1. A method for treating a group III nitride substrate, comprising:
   a CMP step of chemically mechanically polishing a surface of a group III nitride substrate;
   a temperature elevating step of elevating a temperature of said group III nitride substrate after said CMP step to an annealing temperature of 950° C. or higher and 1150° C. or lower under a nitrogen gas atmosphere; and
   an annealing step of holding said group III nitride substrate whose temperature has been elevated to said annealing temperature through said temperature elevating step for four minutes or more and eight minutes or less in a first mixed atmosphere of a hydrogen gas and a nitrogen gas or a second mixed atmosphere of a hydrogen gas and an ammonia gas.

2. The method for treating a group III nitride substrate according to claim 1, wherein a mixing ratio of the hydrogen gas in said first and second mixed atmospheres is set to 1/10 to 8/10.

3. The method for treating a group III nitride substrate according to claim 1, wherein said annealing temperature is 1000° C. or higher and lower than 1100° C.

4. A method for manufacturing an epitaxial substrate in which a group III nitride layer is epitaxially formed on a group III nitride substrate, the method comprising:
   a CMP step of chemically mechanically polishing a surface of a group III nitride substrate;
   a placing step of placing said group III nitride substrate after said CMP step in an apparatus for epitaxially forming a group III nitride layer on said group III nitride substrate;
   a temperature elevating step of elevating a temperature of said group III nitride substrate after said placing step to an annealing temperature of 950° C. or higher and 1150° C. or lower under a nitrogen gas atmosphere in said apparatus;
   an annealing step of holding said group III nitride substrate whose temperature has been elevated to said annealing temperature through said temperature elevating step for four minutes or more and eight minutes or less in a first mixed atmosphere of a hydrogen gas and a nitrogen gas or a second mixed atmosphere of a hydrogen gas and an ammonia gas in said apparatus; and
   an epitaxially forming step of epitaxially forming said group III nitride layer on said group III nitride substrate after said annealing step in said apparatus.

5. The method for manufacturing an epitaxial substrate according to claim 4, wherein a mixing ratio of the hydrogen gas in said first and second mixed atmospheres is set to 1/10 to 8/10.

6. The method for manufacturing an epitaxial substrate according to claim 4, wherein said annealing temperature is 1000° C. or higher and lower than 1100° C.

7. The method for manufacturing an epitaxial substrate according to claim 4, wherein a temperature for epitaxially forming said group III nitride layer in said epitaxially forming step is made identical to said annealing temperature.

8. The method for treating a group III nitride substrate according to claim 2, wherein said annealing temperature is 1000° C. or higher and lower than 1100° C.

9. The method for manufacturing an epitaxial substrate according to claim 5, wherein said annealing temperature is 1000° C. or higher and lower than 1100° C.

10. The method for manufacturing an epitaxial substrate according to claim 5, wherein a temperature for epitaxially forming said group III nitride layer in said epitaxially forming step is made identical to said annealing temperature.

11. The method for manufacturing an epitaxial substrate according to claim 6, wherein a temperature for epitaxially forming said group III nitride layer in said epitaxially forming step is made identical to said annealing temperature.

\* \* \* \* \*